(12) United States Patent
Stewart et al.

(10) Patent No.: US 6,223,148 B1
(45) Date of Patent: *Apr. 24, 2001

(54) LOGIC ANALYSIS SYSTEM FOR LOGIC EMULATION SYSTEMS

(75) Inventors: Kem Stewart, Lexington; Charles W. Selvidge, Charlestown; Kenneth Crouch, Cambridge; Marina Wong, Wilmington; Mark Seneski, Jamaica Plain, all of MA (US)

(73) Assignee: IKOS Systems, Inc., Cupertino, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/133,959

(22) Filed: Aug. 14, 1998

Related U.S. Application Data (63) Continuation of application No. 08/574,259, filed on Dec. 18, 1995, now Pat. No. 5,802,348.

(51) Int. Cl.$^7$ .................................................. G06F 11/25
(52) U.S. Cl. ............................ 703/25; 713/400; 714/39; 714/724
(58) Field of Search ........................ 395/500, 183.15, 395/551; 371/22.1; 364/578; 324/158.1, 73.1, 72.5; 703/25, 27; 713/400; 714/39, 724

(56) References Cited

U.S. PATENT DOCUMENTS

| | | | |
|---|---|---|---|
| 3,983,379 | * 9/1976 | Scott | 235/152 |
| 4,541,100 | * 9/1985 | Sutton et al. | 375/10 |
| 4,782,461 | * 11/1988 | Mick et al. | 364/900 |
| 4,857,774 | * 8/1989 | El-Ayat et al. | 307/465 |
| 5,109,353 | * 4/1992 | Sample et al. | 364/578 |
| 5,406,209 | * 4/1995 | Johnson et al. | 324/750 |
| 5,418,452 | * 5/1995 | Pyle | 324/158.1 |
| 5,425,036 | * 6/1995 | Liu et al. | 371/23 |
| 5,475,624 | * 12/1995 | West | 364/578 |
| 5,513,338 | * 4/1996 | Alexander et al. | 395/500 |
| 5,548,794 | * 8/1996 | Yishay et al. | 395/871 |
| 5,572,710 | * 11/1996 | Asano et al. | 395/500 |
| 5,596,742 | * 1/1997 | Agarwal et al. | 395/500 |

(List continued on next page.)

OTHER PUBLICATIONS

Babb et al., "Virtual Wires: Overcoming Pin Limitations in FPGA based Logic Emulators", IEEE, 1993, p. 142–150.*
Jones et al., "A Time–Multiplexed FPGA Architecture for Logic Emulation", IEEE, 1995, p. 495–498.*
Babb et al., "Logic Emulation with Virtual Wires," IEEE, 1997, p. 609–626.*

Primary Examiner—Kevin J. Teska
Assistant Examiner—Thai Phan
(74) Attorney, Agent, or Firm—Hamilton, Brook, Smith & Reynolds, P.C.

(57) ABSTRACT

A portion of a logic emulation system is configured to sample logic values from the portion of the emulation system that is used to emulate the user digital logic design. These sampled values are then multiplexed by the emulation system to a logic analysis device. Typically, this is a commercially-available logic analyzer. To achieve this functionality, the emulation system is provided with a clock signal that has a higher frequency than the emulation clock signal received from the target or user system. This high speed clock signal is provided to logic analyzer as a strobe signal and controls the transfer of words of logic values from the emulation system to the logic analyzer. As a result, the number of signals that the logic analyzer can effectively sample for a cycle of the emulation clock is increased. Each probe of the logic analyzer can now receive multiple time-division multiplex logic values for each emulation clock cycle thus, increasing the width of logic analysis that can be performed on a particular emulation system with the conventional logic analyzers.

27 Claims, 6 Drawing Sheets

U.S. PATENT DOCUMENTS 5,649,176 * 7/1997 Selvidge et al. ...................... 395/551
5,680,592 * 10/1997 Priem ................................... 395/527
5,802,348 * 9/1998 Stewart et al. ........................ 395/500
5,960,191 * 9/1999 Sample et al. .................. 395/500.49

* cited by examiner

LOGIC ANALYSIS SYSTEM FOR LOGIC EMULATION SYSTEMS

RELATED APPLICATION

This application is a Continuation of co-pending application Ser. No. 08/574,259, filed Dec. 18, 1995 now U.S. Pat. No. 5,802,348, the contents of which are incorporated herein by reference in its entirety.

BACKGROUND OF THE INVENTION

Reconfigurable or programmable logic devices are a general class of logic devices that can be easily configured to perform a desired logic operation. Field programmable gate arrays (FPGA) are a typical example. These devices may be programmed many times to perform different logic operations. Most importantly, they can be programmed to create gate array prototypes instantaneously, allowing complete dynamic reconfigurability.

System designers commonly use reconfigurable logic devices such as FPGAs to test digital logic designs prior to manufacture or fabrication for hardware debugging or to expose other design flaws. Usually, these tests are termed emulations in which a reconfigurable logic system constructed from the devices models the logic design, such as a microprocessor, in order to confirm the proper operation of the logic design along with possibly its compatibility with an environment or user system in which it is intended to operate. In the tests, a netlist describing the internal architecture of the logic design is compiled for a specific class of reconfigurable devices and then loaded by some type of configuring system, such as a host workstation, into a reconfigurable system constructed from the class of devices. If the reconfigurable logic system is a single or array of FPGAs, the loading step is as easy as down-loading a file describing the compiled netlist to the FPGAs. The programmed configurable logic system is then tested in the user environment by confirming that its response to user data signals and user clock signals agrees with the design specifications for the design.

Recently, most of the attention in complex logic design modeling has been directed to reconfigurable systems built from heterogeneous networks of special purpose FPGA processors connected to exchange signals via some type of interconnect. The networks are heterogeneous not necessarily in the sense that they are composed of arrays of different devices but that the devices have been individually configured to cooperatively execute different sections, or partitions, of the overall user logic design. These networks rely on static routing at compile-time to organize the propagation of logic signals through the FPGA network. Static refers to the fact that all data or logic signal movement can be determined and optimized during compiling.

Logic analysis techniques are often applied to these FPGA networks. Typically, the networks are constructed for the intended purpose of identifying flaws in the user design. Other times, however, a flaw may exist at the level of the FPGA network. That is, the logic design may not be the source of the problem but, in the process of adapting the user logic design to the FPGA network, some improper operation such as hold time errors arose. Logic analysis is a process by which digital logic values of logic signals propagating within the FPGA processor are sampled and compared with the values those logic signals should have if the system were operating properly. When improper operation is discovered according to this process, faults in the original user logic design or at the level of the compiled netlist can be corrected by reconfiguration and reloading a new compiled netlist.

A logic analyzer is commonly used to perform the logic analysis. These devices have a number of channels with corresponding probes that are physically connected to the conductors in the FPGA network on which the logic signals of interest propagate. The logic analyzer is then provided with some trigger condition. Usually, a trigger condition is at least in part defined by the user clock signal, i.e., the clock signal from the user environment defining the operation cycles of the FPGA network. The trigger condition is also usually established by other logic signals from the FPGA network. For example, if it is known that a particular logic design is not operating properly during data writes to a bus, then the trigger condition might be enabled in part in response to a write enable signal within the logic design. At occurrence of the trigger condition, the analyzer samples the logic signals.

Other logic analysis tools are known for FPGA networks. Since the FPGA networks are completely configurable and additional processing power is added by providing additional FPGAs, some have implemented a logic analyzer in the FPGA network alongside the portion of the network that is dedicated to emulating or modeling the user logic design. Usually, such a system takes the form of a circular or FIFO, first-in-first-out, buffer. Logic values from the logic signals of interest are written to the buffer until a trigger condition is met. At this point, the contents of the buffer are frozen. A host workstation can then be used to read out the contents of the buffer for analysis to determine the origin of any faults or confirm the proper operation.

SUMMARY OF THE INVENTION

One of the most significant problems that arises when using commercially available logic analyzers on FPGA networks is the fact that there is a fundamental difference in the type of analysis that the logic analyzers are designed to perform and the type of analysis that is required when surveying the FPGA network. Commercially available logic analyzers provide the functionality required by the largest segments of the commercial markets for these devices. And, most applications for the devices involve the logic analysis of conventional logic circuits that have a single microprocessor chip, memory, and peripheral devices, for example. Such systems operate relatively quickly, such as a hundred megahertz, and have only few logic signals available for sampling since most signals are hidden within the chips. The chips perform comparatively complex logic operations and logic signals are only available at the boundaries of these chips. The commercial analyzers are not designed for the logic analysis of FPGA processing networks comprising a large number of FPGA chips, each having a relatively low level of integration in the sense of the number or complexity of logic operations that each chip can perform. Here, a much larger range of signals are available since signals that would usually be entirely within a microprocessor, for example, are now exposed and available to be sampled by the logic analyzer. Further, the FPGA processors operate at slowed user clock speeds of, for example, one or two MHz. In short, commercially available logic analyzers are designed to sample relatively few signals, but sample these signals at a very high clock rate. In contrast, the logic analysis of FPGA networks does not require fast signal sampling since the user clock is typically slow. A much wider range of logic signals, however, are available and would desirably be sampled in order to provide a generous spectrum of signals from which to assess the operation of the network.

The present invention overcomes the above-identified problems while still relying on the commercially available logic analyzers. As a result, the complex logic analysis tools need not be programmed into the logic design as provided in some approaches nor provided as dedicated logic analysis circuitry, as in others. This adds convenience in the easy operation of commercially available logic analyzers and their programmable trigger conditions. The number of signals that the logic analyzer can effectively sample is increased by configuring the FPGA system or other programmable device network to time-division multiplex logic values of the desired logic signals to the logic analyzer for cycles of the user or emulation clock signal. Therefore, in contrast to the past where only a single probe of the logic analyzer could be used to sample a single signal during a cycle of the user clock, that probe can now sample as many logic signals as can be multiplexed from the FPGA network to the logic analyzer in the user clock cycle.

In specific embodiments, the multiplexing clock signal generated by the clock generator is a virtual clock signal for the logic emulation system.

In other embodiments, the multiplexing clock signal is transmitted to the logic analyzer as a strobe signal. Additionally, new signals can be constructed by the device network, i.e., signals in addition to those needed to realize the user design, to assist in the analysis of the logic values that are sent to the analyzer. In some cases, these tag signals identify the logic values that are being simultaneously transmitted to the logic analyzer. In other cases, the tag signals are provided to the logic analyzer to develop a trigger condition. This latter case is especially useful when, due to the multiplexing of the logic values, the logic analyzer must compare values over several clock cycles in order to formulate its trigger condition.

As to other specifics of configuration, the portion of the programmable device network that time-division multiplexes logic values comprises a multiplexor circuit that receives and transmits logic values to the logic analyzer from the portion of the network that is used to realize the user digital logic design. A control circuit such as a finite state machine is also defined to control the multiplexor circuit and its sampling of the logic signals. It should be noted that the portion of the FPGA network that multiplexes the logic values can alternatively be implemented on a separate device, or it can be implemented in the same FPGA network as that configured to emulate the user design. In the latter case, the multiplexing portion can either be discrete or be distributed throughout the network.

The above and other features of the invention including various novel details of construction and combinations of parts, and other advantages, will now be more particularly described with reference to the accompanying drawings and pointed out in the claims. It will be understood that the particular method and device embodying the invention is shown by way of illustration and not as a limitation of the invention. The principles and features of this invention may be employed in various and numerous embodiments without the departing from the scope of the invention.

BRIEF DESCRIPTION OF THE DRAWINGS

In the accompanying drawings, reference characters refer to the same parts throughout the different views. The drawings are not necessarily to scale; emphasis has instead been placed upon illustrating the principles of the invention. Of the drawings.

DETAILED DESCRIPTION OF THE PREFERRED EMBODIMENTS

Figure 1A:
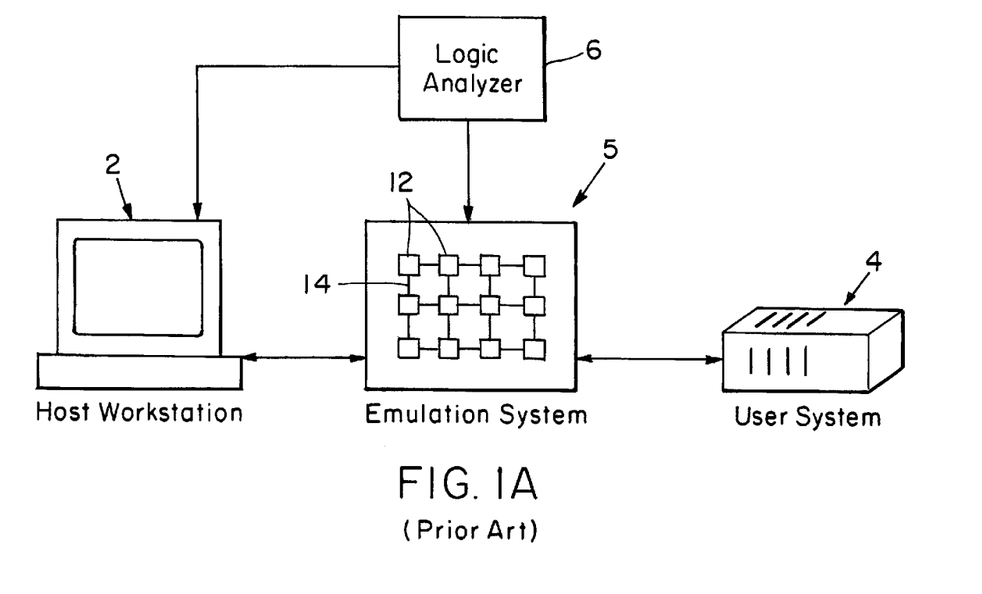
FIG. 1A is a schematic diagram of an emulation system that is configurable by a host workstation to operate in a user system with a logic analyzer connected to enable the sampling of logic signals from the emulation system as known in the prior art.

FIG. 1A illustrates the typical setup for the logic design emulation process. An emulation system 5 operates in an environment such as the user system 4 from which it receives at least one user or emulation clock signal and user data signals. In response to these signals, it generates output data signals to the user system 4. A configuring device 2, such as a host workstation, is used to load configuration data into the emulation system 5. Further, a logic analyzer 6 is connected to the emulation system 5 to allow a logic designer to monitor the operation of the emulation system. Specifically, the logic analyzer 6 connects to conductors of the interconnect 14 to sample logic signals that are transmitted on the interconnect.

The emulation system 5 is constructed from individual reconfigurable logic devices 12, such as FPGA chips. The FPGA chips may be connected to each other via a Manhattan-type interconnect 14 shown. Other topologies are equivalent alternatives, however, such as cross-bar or other hierarchial interconnects.

The host workstation 2 downloads configuration data that dictates the internal logic configuration of the logic devices 12, and possibly the interconnect 14. The configuration data is compiled from a digital circuit description by a vendor-specific compiler. Typically, the user system 4 is a relatively large electronic system for which some component or components, such as a microprocessor, are being designed. The digital logic description applies to this microprocessor and the emulation system loaded with the configuration data behaves or operates as the microprocessor would, with some exceptions. In almost every case, the user or emulation clock signal must be slowed down since the emulation system 5 must operate at a slower speed than the ultimate digital logic design will operate when it is actually fabricated. This is because the circuit construction of the FPGAs are for general purpose logic operations and have not been optimized for the particular digital logic design.

The host workstation is also connected to the logic analyzer 6. This way, logic values read by the analyzer can be further organized by the workstation to aid in debugging, etc.

Figure 1B:
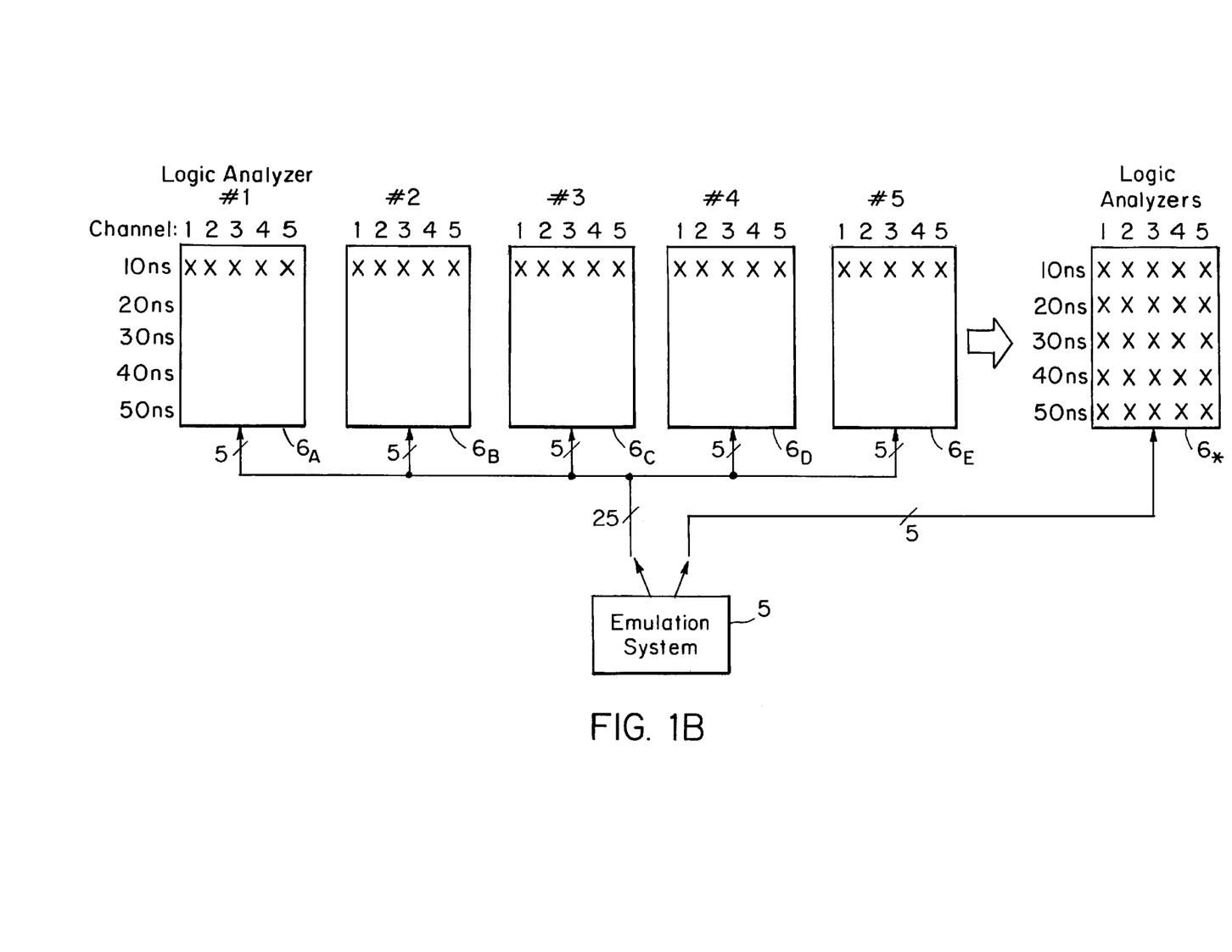
FIG. 1B illustrates the capability of the present invention for fully utilizing the processing bandwidth of the analyzer.

FIG. 1B schematically shows the typical approach for sampling logic signals from the emulation system 5 compared with the advantages provided by the present invention. Desirably, some collection of logic signals are required for logic analysis from the emulation system 5 for every cycle of the emulation clock signal. Usually, the emulation clock signal is used as the strobe signal to initiate data acquisition by the logic analyzer 6. If the number of the logic signals exceeds the number of the logic analyzer's channels then additional analyzers are required to make up the sampling deficit. In the example of FIG. 1B, five logic analyzer $6_A$–$6_E$ having five channels each are required to sample twenty-five logic signals. This approach suboptimally uses the analyzers. If the sampling bandwidth of the analyzers is illustrated by grid with possible sampling times along the vertical axis and the number of channels along the horizontal axis, the inefficiency is apparent. Each analyzer $6_A$–$6_E$ has a maximum sampling rate of 100 MHz, for example, providing the capability of sampling once every 10 nanoseconds, but since the emulation clock is running at only 20 MHz, the analyzers are required to sample only once every 50 nsecs.

In the present invention, illustrated to the right of FIG. 1B, a faster multiplexing clock is defined, 100 MHz for example. This clock is used at the emulation system to time-division multiplex the logic values. The logic analyzer $6_*$ is strobed by the clock to sample logic signals at this rate. As a result, ability of the logic analyzer $6_*$ to sample every 10 nsecs is fully utilized, enabling a single logic analyzer $6_*$ to perform the function associated with multiple devices.

Figure 2:
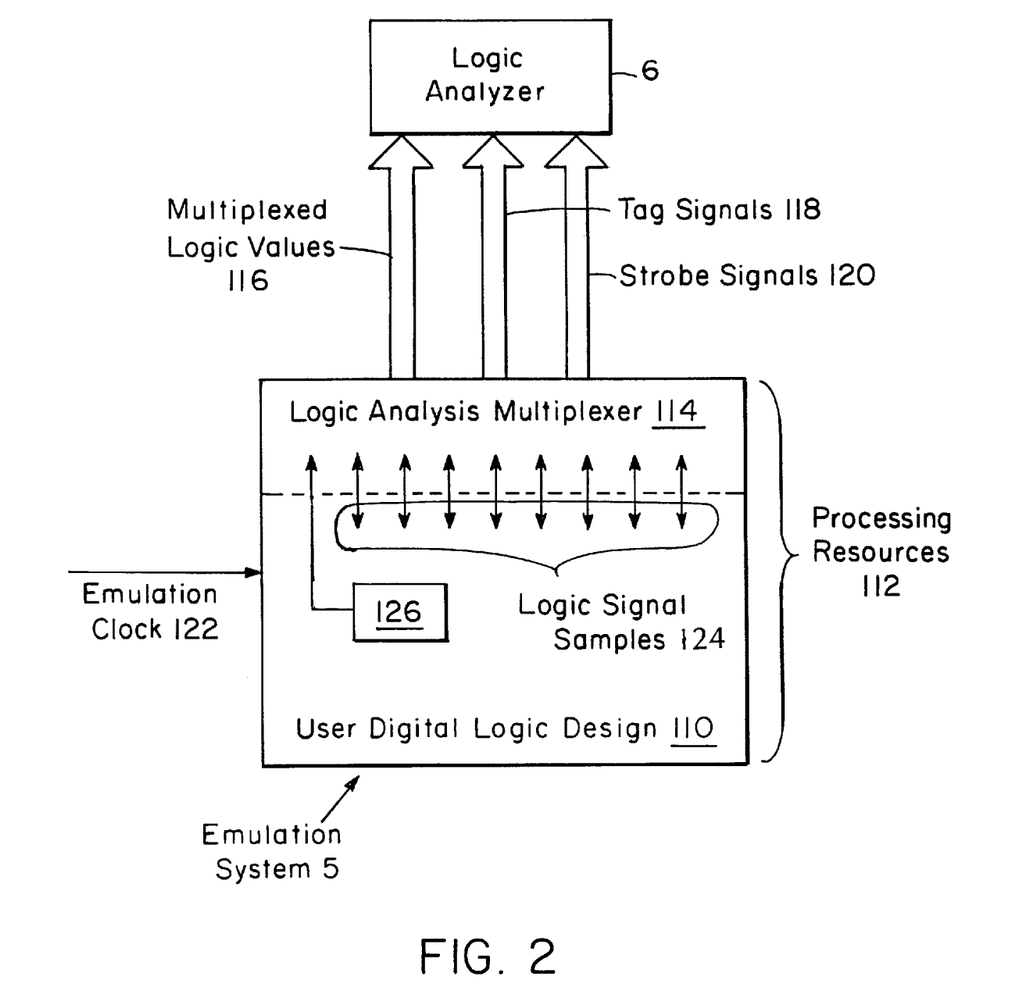
FIG. 2 is a schematic diagram showing signal flow between the logic analyzer and the emulation system according to the present invention.

FIG. 2 illustrates the implementation of a logic analysis multiplexor 114 as an interface between the commercially available logic analyzer 6 and the remaining portion 110 of the emulation system 5, according to the invention. In more detail, if the total logical processing power of the FPGA chips 12 and interconnect 14 are lumped together and identified generically as the processing resources 112 of the emulation system 5, a portion of these processing resources are allocated to the logic analysis multiplexor 114. This is in addition to the portion that is allocated to realize the user digital logic design 110. Although the FIG. 2 suggests that the logic analysis multiplexor is located in a discrete section of the logic emulator 5, this is not necessarily required. It could be highly distributed throughout the system 5. On the other side of the coin, however, it is not necessary that the logic analysis multiplexor 114 be implemented in the same devices, FPGAs 12, as the digital circuit design 110. In some situations, different types of FPGAs or special purpose multiplexing components, an ASIC for example, may be preferable. These components may have better operational characteristics and thus may be preferred to realize the functionality required by the multiplexor 114.

Generally, the logic analysis multiplexor 114 samples logic signals 124 and multiplexes the corresponding logic values 116 to the logic analyzer 6. As a result, each physical connection between the logic analyzer 6 and the emulation system 5 carries multiple signals for every cycle of the emulation or user clock signal 122 from the emulation system 5. The multiplexing is performed in response to a multiplexing clock generator 126 that is local and typically located on the emulation system 5. This multiplexing clock signal is also provided to the logic analyzer 6 on one of its probes as strobe signals 120 so that the logic analyzer 6 can synchronize to the multiplexed logic values 116.

In some cases, the user system 4 may provide multiple user clock signals 122 to the emulation system 5. Typically, a distinct multiplexing clock generator 126 is assigned to each user clock signal. A separate logic analysis multiplexor 114 is then operated by each multiplexing clock generator 126. In this way, logic signals of the logic design 110 are sampled based upon the relevant user clock signal 122.

The logic analysis multiplexor 114 also constructs and provides tag signals 118 on certain probes of the logic analyzer 6. These tag signals 118 are derived in response to conditions within the user digital logic design 110. They are distinguished from the logic values 116 in that they are not necessary to the realization of the user digital logic design 110. Instead, the tag signals are developed to facilitate the logic analysis by, in some cases, serving as identifiers for the logic values 116 that are being transmitted to the logic analyzer 6 simultaneously with them. In other cases, the logic values of the tag signals serve as a trigger condition for the logic analyzer 6. This latter implementation is especially useful where to properly develop a trigger condition, the logic analyzer 6 must compare logic values across several periods of the multiplexing clock signal. According to the invention, the processing associated with developing the trigger condition from the user logic design 110 is exported to the logic analysis multiplexor 114 in whole or in part. A single tag signal can then, for example, be used as the trigger condition or some combination of tag signals 118 and the multiplexed logic values 116 from the perspective of the analyzer 6.

Figure 3:
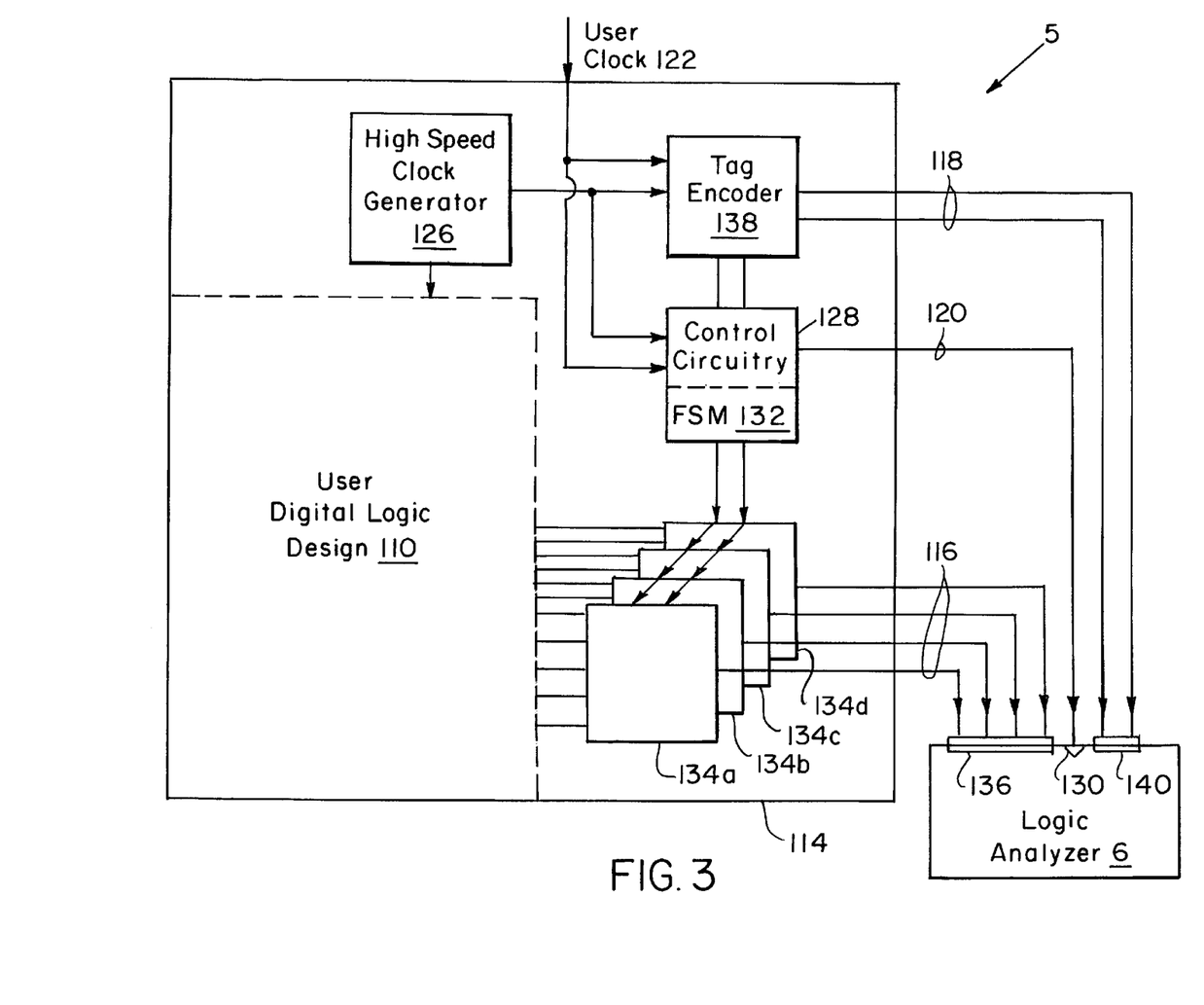
FIG. 3 is a block diagram illustrating one configuration for the logic signal multiplexor of the present invention.

FIG. 3 shows the processing components of the logic analyzer multiplexor 114. The high speed clock generator 126 provides the multiplexing clock signal that defines the time period between multiplexed logic values. This clock signal is typically at least four times faster than the user clock signal 122 and can be as fast as an order of magnitude faster. In many emulation systems, this high speed clock generator will need to be added to support the logic analysis multiplexor 114. In some cases, however, the emulation system already has a clock signal having the appropriate speed. For example, U.S. patent Ser. No. 08/513,605, filed on Aug. 10, 1995, entitled "Transition Analysis and Circuit Resynthesis Method and Device for Digital Circuit Modeling", of which the present inventor was a joint inventor, U.S. patent Ser. No. 08/344,723, filed on Nov. 23, 1994, entitled "Pipe-Lined Static Router and Scheduler for Configurable Logic System Performing Simultaneous Communications and Computation", and U.S. patent Ser. No. 08/042,151 entitled "Virtual Wires for Reconfigurable Logic Systems" all disclose emulation systems that have a higher speed clock on board that allows the emulation system to operate at a clock rate in excess of the user's clock. The teachings of these applications are incorporated herein by this reference in their entirety. In the context of these systems, the local emulation system or virtual clock can be used as the multiplexing clock in the present invention.

Control circuitry 128 operates in response to the high speed clock signal and the user or emulation clock signal 122. The control circuitry 128 may pass the high speed clock through as the strobe signal 120 on a strobe logic analysis channel 130 of the logic analyzer or may generate the strobe signal based in part on the incoming user clock signal. The control circuitry 128 also implements a finite state machine 132 that controls parallel multiplexing circuits 134a–134d. Under the control of this finite state machine 132, each multiplexing circuit 134a–134d selectively samples the logic signals from the portion of the emulation system that is configured to emulate the user design 110. The corresponding logic values 116 are then multiplexed on the data logic analysis channels 136 of the logic analyzer 6 as dictated by the finite state machine 132.

The finite state machines 132 of the control circuitry 128 are properly constructed at the time of compilation to control the sampling of the multiplexing circuits 134a–134d of the desired logic signals and then the transmission of the corresponding logic values to the logic analyzer 6. Engineered into the finite state machine 132 is the implicit knowledge of when particular logic signals are valid. Since some logic signals may be the result of complex processing, they may not be ready for sampling early in the emulation clock cycle. The finite state machine is generated by the host workstation 2 in view of this situation to ensure the validity of the logic signal prior to sampling.

A tag encoder 138 is also provided and operates in response to the high speed clock signal and user clock signal 122. This encoder connects to the tag logic analysis channels 140 of the logic analyzer 6 and generates the tag signals to identify the source, origin, and significance of the logic values that are being simultaneously transmitted to the logic analyzer 6 or perform some or all of the trigger signal processing as described earlier. In order to provide trigger processing, the tag encoder may have access to data signals entering the multiplexors 134a–134d.

Figure 4:
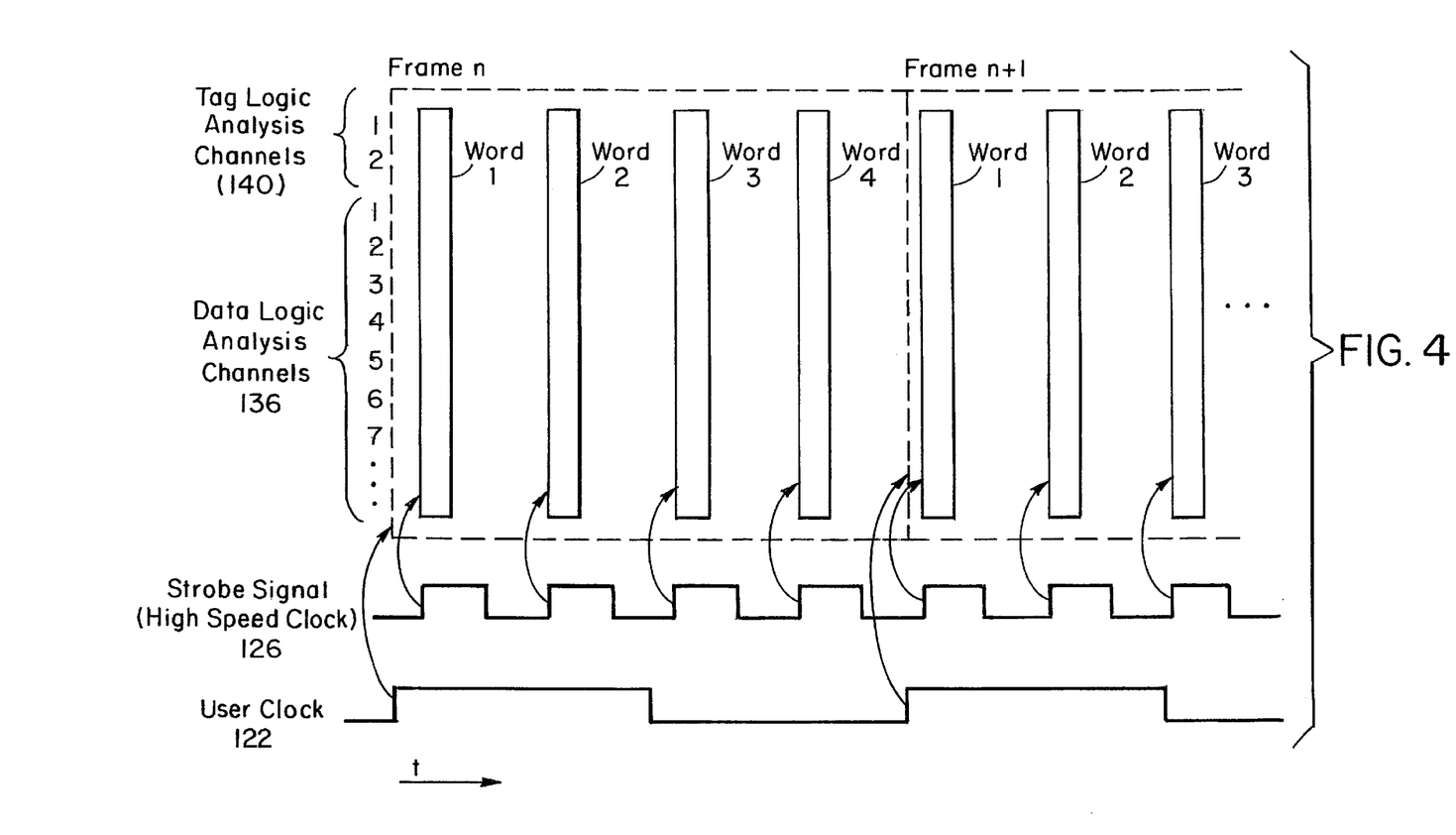
FIG. 4 is a timing diagram showing the organization of frames of logic values and the timing relationship to strobe signals and the user's clock.

FIG. 4 is a timing diagram illustrating the temporal organization of the multiplexed logic values transmitted to the logic analyzer channels. As shown, the two relevant timing signals, the user or emulation clock 122 and the high speed clock signal 126, define the timing of the logic values. In more detail, the logic values are divided into frames n, n+1, which are determined by the user clock 122. The emulation system 5 operates in response to the user clock and completes the necessary logic calculations within cycles of the user clock in order to properly interact with the user system. Every frame of the logic values defines the relevant logic values for some cycle of the user clock.

Groups or words 1–4 of logic values are transmitted in parallel from the multiplexing portion to the logic analyzer in parallel along the logic analyzer's logic analysis channels 136 in response to every cycle of the high speed clock signal or strobe 126. A specific logic value is transmitted on every one of the data channels in response to this signal. The tag signals 118 are also provided to the tag logic analysis channels 140 for every cycle of the strobe signal. As a result, where conventional logic analyzers would be strobed by the user clock signal, the present invention selects a faster high speed clock signal to control the sampling of the logic analyzer. Thus, a broader spectrum of logic values for every cycle of the user clock can be transmitted to the logic analyzer, effectively increasing the number of sampling channels.

Figure 5:
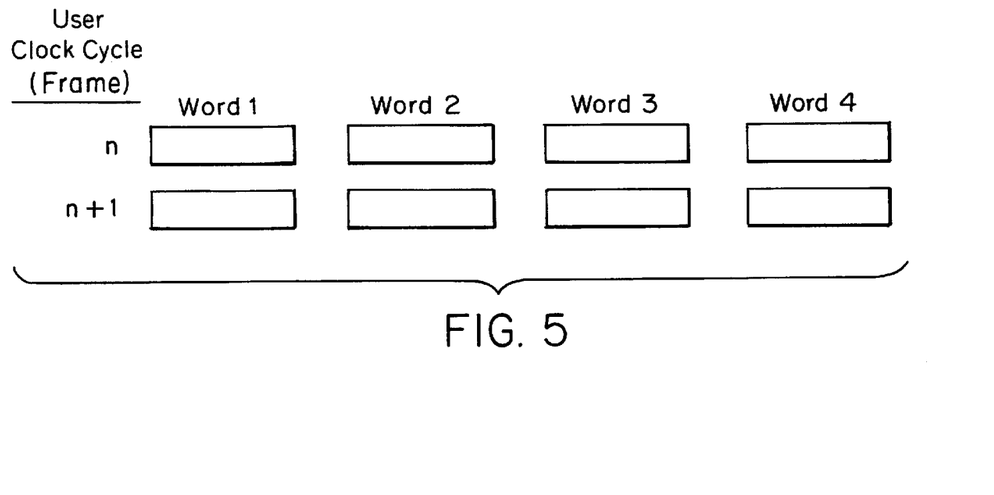
FIG. 5 illustrates the demultiplexing of the logic values contained in the frames transmitted to the logic analyzer.

FIG. 5 illustrates the demultiplexing of the logic values that occurs either at the logic analyzer 6 or at a host workstation 2 to which the logic analyzer is connected. Each frame n, n+1, . . . of the logic values is decomposed and reconstructed into the logic values that were sampled for the corresponding cycle of the user clock. Facilitating this decomposition are the tag signals 118 that allow the identification of specific parallel words of the logic values. With proper decomposition, every user clock signal can be aligned with a different set of logic values.

Figure 6:
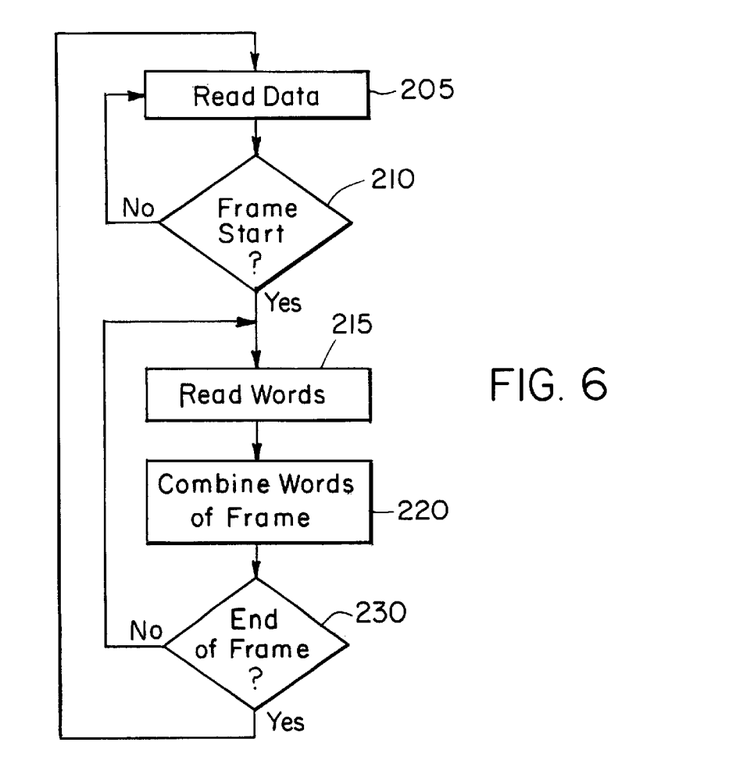
FIG. 6 is a flow diagram showing the process of decomposition of the present invention.

The process of decomposition is illustrated in the flow chart of FIG. 6. The data is reviewed step 205 until the beginning of a frame is identified step 210. This can be accomplished by reference to the tag information 118 and/or the trigger condition of the logic analyzer 6. Each word is then successively read step 215 and combined step 220 with earlier words from the frame, and the tag information is removed. This process of combining the information from the word is repeated until the end of the frame is detected step 230. The entire process is then repeated for the next frame. After decomposition, the data in the host workstation 2 is in a format useful to the logic designer. The multiplexed format, necessary only to get the logic values off the emulator system 5, has been removed. Also the tag signals required to identify the logic values in the multiplexed format or for triggering are deleted as they are extraneous to the emulation of the user digital logic design itself.

While this invention has been particularly shown and described with references to preferred embodiments thereof, it will be understood by those skilled in the art that various changes in form and details may be made therein without departing from the spirit and scope of the invention as defined by the appended claims.

We claim:

1. A logic analysis system for a digital logic emulation system configured to model a digital system and operating in response to at least one emulation clock signal, the logic analysis system comprising:
   a clock signal generator for generating a multiplexing clock signal;
   a configurable multiplexing subsystem for transmitting logic values of logic signals from the digital logic emulation system to a logic analyzer, the multiplexing subsystem multiplexing multiple logic values on channels of the logic analyzer for cycles of the emulation clock in response to the multiplexing clock signal; and
   a controller which configures the multiplexing subsystem.

2. A system as described in claim 1, wherein the multiplexing clock signal from the clock generator has a frequency that is higher than each one of the emulation clock signals.

3. A system as described in claim 1, wherein the multiplexing subsystem transmits the multiplexing clock signal to the logic analyzer as a strobe signal.

4. A system as described in claim 1, wherein the multiplexing subsystem is implemented in a reconfigurable logic system in which the digital logic emulation system is implemented.

5. A system as described in claim 1, wherein the multiplexing subsystem transmits tag signals to the logic analyzer to identify the logic values being transmitted to the logic analyzer.

6. A system as described in claim 1, wherein the multiplexing subsystem comprises:
   a multiplexor circuit for receiving and then transmitting the logic values to the logic analyzer; and
   a controller for controlling the multiplexor circuit to sample the logic signals to obtain the logic values and to transmit the logic values.

7. A logic emulation system including reconfigurable logic devices and an interconnect for transmitting logic signals between the logic devices, and being configured to comprise:
   a digital logic emulation portion for modeling a digital system operating in response to at least one emulation clock signal; and
   a logic analysis multiplexing portion for transmitting logic values of logic signals from the digital logic emulation portion to a logic analysis device.

8. A system as described in claim 7, wherein the logic analysis multiplexing portion transmits multiple logic values on channels of the logic analysis device for cycles of the emulation clock signal.

9. A system as described in claim 7, further comprising a clock signal generator for generating a multiplexing clock signal having a higher frequency than the emulation clock signal.

10. A system as described in claim 9, wherein the logic analysis multiplexing portion multiplexes the logic values transmitted to the logic analysis device in response to the multiplexing clock signal.

11. A system as described in claim 7, wherein the reconfigurable logic devices comprise FPGA's.

12. A method for sampling digital signals from a digital logic emulation system configured to operate in a digital system having an emulation clock signal, the method comprising:

configuring an emulated circuit and a logic analysis multiplexor;

sampling selected digital signals within the emulation system;

collecting digital signal values associated with the sampled digital signals for cycles of the emulation clock signal; and in the configured logic analysis multiplexor, multiplexing multiple ones of the digital signal values to a logic analysis device in individual cycles of the emulation clock signal.

13. A method as described in claim 12, further comprising:

generating a multiplexing clock signal; and multiplexing of the digital signal values to the logic analysis device in response to the multiplexing clock signal.

14. A method as described in claim 13, further comprising:

transmitting the multiplexing clock signal to the logic analysis device; and triggering the logic analysis device in response to the multiplexing clock signal.

15. A method as described in claim 12, further comprising demultiplexing the digital signal values received from the emulation system.

16. A method as described in claim 15, further comprising displaying the demultiplexed signal values in association with the emulation clock signal.

17. A method as described in claim 12, further comprising multiplexing of the digital signal values to the logic analysis device in response to a virtual clock signal of the emulation system.

18. A method as described in claim 12, further comprising transmitting tag signals to the logic analysis device to identify the digital signal values being transmitted to the logic analysis device.

19. A method as claimed in claim 18, further comprising demultiplexing the logic values in response to the tag signals and aligning the logic values to correspond to cycles of the emulation clock signal.

20. A method as claimed in claim 18, further comprising triggering the logic analysis device at least in part in response to the tag signals.

21. A method as described in claim 12, wherein the step of sampling selected digital signals comprises sampling digital signals generated in programmable logic devices of the digital logic emulation system.

22. A method for configuring a logic emulation system including reconfigurable logic devices and an interconnect for transmitting logic signals between the logic devices, the method comprising:

programming the logic emulation system to have a digital logic emulation portion for modeling a digital system operating in response to at least one emulation clock signal; and programming the logic emulation system to have a logic analysis multiplexing portion for transmitting logic values of logic signals from the digital logic emulation portion to a logic analysis device.

23. A method as described in claim 22, further comprising programming the logic emulation system to multiplex multiple logic values on channels of the logic analysis device for every cycle of the emulation clock signal.

24. A system as described in claim 23, where the digital logic emulation system comprises a plurality of programmable logic chips and an interconnect connecting the chips.

25. A method as described in claim 22, wherein the step of programming the logic emulation system comprises programming reconfigurable logic devices within the logic emulation system in response to operating parameters of the digital system.

26. A digital logic analysis system, comprising:

a target system for generating at least one target system clock signal and data signals;

a programmable emulation system for executing a logic design being responsive to the target system clock signal and the data signals and generating data signals to the target system, the emulation system including a clock signal generator for generating a multiplexing clock signal;

a logic analysis device connected to the emulation system for sampling logic signals within the emulation system;

a configuring device for programming the emulation system to execute the logic design and multiplex logic values of the logic signals to the logic analyzer for every cycle of the target system clock signal in response to the multiplexing clock signal.

27. A logic analysis system for a digital logic emulation system configured to model a digital system and operating in response to at least two emulation clock signals, the logic analysis system comprising:

a clock signal generator associated with each emulation clock signal for generating a multiplexing clock signal in response to the corresponding emulation clock signal;

a configurable multiplexing subsystem associated with each clock signal generator for transmitting logic values of logic signals from the digital logic emulation system to a logic analyzer, the multiplexing subsystem multiplexing multiple logic values on each channel of the logic analyzer for every cycle of the corresponding emulation clock in response to the corresponding multiplexing clock signal; and a controller which configures the multiplexing subsystem.

* * * * *

UNITED STATES PATENT AND TRADEMARK OFFICE
CERTIFICATE OF CORRECTION

PATENT NO. : 6,223,148 B1
DATED : April 24, 2001
INVENTOR(S) : William K. Stewart, Charles W. Selvidge, Kenneth Crouch, Marina Wong and Mark Seneski

It is certified that error appears in the above-identified patent and that said Letters Patent is hereby corrected as shown below:

Title page,
Inventors, change "Kem Stewart, Lexington" to -- William K. Stewart, Lexington --;

Signed and Sealed this

Thirteenth Day of November, 2001

Attest:

NICHOLAS P. GODICI
Attesting Officer    Acting Director of the United States Patent and Trademark Office